(12) United States Patent
Schrank et al.

(10) Patent No.: US 11,460,181 B2
(45) Date of Patent: Oct. 4, 2022

(54) LED MODULE AND USE OF THE LED MODULE

(71) Applicant: TDK Electronics AG, Munich (DE)

(72) Inventors: Franz Schrank, Raaba (AT); Thomas Feichtinger, Graz (AT)

(73) Assignee: TDK ELECTRONICS AG, Munich (DE)

( * ) Notice: Subject to any disclaimer, the term of this patent is extended or adjusted under 35 U.S.C. 154(b) by 0 days.

(21) Appl. No.: 17/419,224

(22) PCT Filed: Nov. 14, 2019

(86) PCT No.: PCT/EP2019/081359
§ 371 (c)(1),
(2) Date: Jun. 28, 2021

(87) PCT Pub. No.: WO2020/147998
PCT Pub. Date: Jul. 23, 2020

(65) Prior Publication Data
US 2022/0065431 A1   Mar. 3, 2022

(30) Foreign Application Priority Data
Jan. 14, 2019   (DE) .......................... 102019100802.6

(51) Int. Cl.
*F21V 23/00*   (2015.01)
*F21Y 113/13*   (2016.01)
*F21Y 115/10*   (2016.01)

(52) U.S. Cl.
CPC ......... *F21V 23/005* (2013.01); *F21Y 2113/13* (2016.08); *F21Y 2115/10* (2016.08)

(58) Field of Classification Search
CPC . F21V 23/005; F21Y 2113/13; F21Y 2115/10
(Continued)

(56) References Cited

U.S. PATENT DOCUMENTS

| 6,523,976 B1* | 2/2003 | Turnbull | ............... F21S 41/151 362/231 |
| 2004/0105264 A1* | 6/2004 | Spero | ..................... B60Q 1/085 362/276 |

(Continued)

FOREIGN PATENT DOCUMENTS

| DE | 102013104276 A1 | 10/2014 |
| DE | 102014105734 A1 | 10/2015 |

(Continued)

OTHER PUBLICATIONS

Nguyen, F., "Challenges in the design of a RGB LED display for indoor applications," Synthetic Metals 122, Elsevier, ISSN: 0379-6779, May 1, 2001, 5 pages.

*Primary Examiner* — Andrew J Coughlin
*Assistant Examiner* — Jessica M Apenteng
(74) *Attorney, Agent, or Firm* — Slater Matsil, LLP

(57) ABSTRACT

In an embodiment an LED module includes a support having at least two segments, wherein each segment is configured to emit light, wherein each segment has at least two light-emitting diodes that differ in terms of their colors, wherein the support has a multilayer structure and/or wherein the support has a substrate having a ceramic material and the ceramic material includes aluminum nitride, aluminum oxide or a varistor ceramic, and wherein the LED module is configured to set a brightness and a color of the emitted light separately for each segment.

14 Claims, 3 Drawing Sheets

(58) Field of Classification Search
USPC .......................................................... 362/231
See application file for complete search history.

(56) References Cited

U.S. PATENT DOCUMENTS

| | | | |
|---|---|---|---|
| 2005/0077525 A1* | 4/2005 | Lynch | F21V 23/0442 |
| | | | 257/74 |
| 2007/0223219 A1 | 9/2007 | Medendorp, Jr. et al. | |
| 2008/0062706 A1* | 3/2008 | Feldmeier | F21S 41/14 |
| | | | 340/468 |
| 2010/0128472 A1* | 5/2010 | Hancock | H05B 45/20 |
| | | | 362/231 |
| 2011/0241549 A1* | 10/2011 | Wootton | F21V 29/60 |
| | | | 257/E33.012 |
| 2013/0301257 A1* | 11/2013 | Britt | H01L 25/0753 |
| | | | 362/249.02 |
| 2016/0293811 A1 | 10/2016 | Hussell et al. | |
| 2017/0088036 A1 | 3/2017 | Roeckl et al. | |
| 2018/0038581 A1 | 2/2018 | Nolan et al. | |
| 2018/0175266 A1 | 6/2018 | England et al. | |

FOREIGN PATENT DOCUMENTS

| | | |
|---|---|---|
| DE | 102015012568 A1 | 3/2017 |
| EP | 1889112 A2 | 2/2008 |
| WO | 2017050727 A1 | 3/2017 |

* cited by examiner

Fig. 4
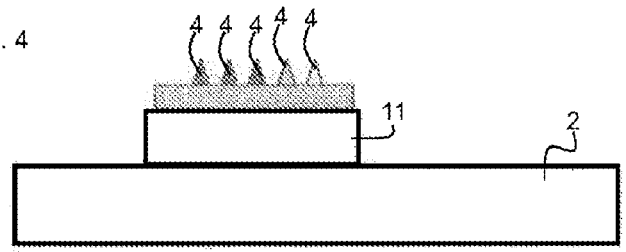
Fig. 5
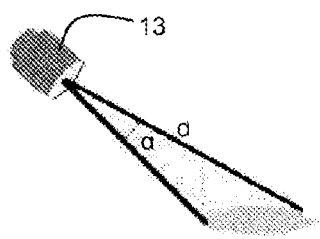
Fig. 6
|  | Office (desk) | Restaurant | Museum | Reading light | Store |
|---|---|---|---|---|---|
| Granularity on object | 1 m | 2 – 100 cm | 5 – 100 cm | 5 cm | 5 – 20 cm |
| Distance d | 2 – 5 m | 2 – 5 m | 2 – 5 m | 1 – 1.5 m | 1 – 3 m |
| Required light | 500 lx | 20 – 200 lx | 300 – 1000 lx | 100 – 300 lx | 500 – 5000 lx |
| Light per pixel | 500 lm | 10 – 200 lm | 100 – 250 lm | 0.3 – 1 lm | 1 – 100 lm |
| FWHM of an individual pixel ($\alpha$) | 30° | 2° | 5 – 10° | 2° | 1 – 5° |

LED MODULE AND USE OF THE LED MODULE

This patent application is a national phase filing under section 371 of PCT/EP2019/081359, filed Nov. 14, 2019, which claims the priority of German patent application 102019100802.6, filed Jan. 14, 2019, each of which is incorporated herein by reference in its entirety.

TECHNICAL FIELD

The present invention relates to an LED module and a method for operating the LED module for illuminating a spatial region. When illuminating a spatial region, it may be desirable to make specific partial regions stand out in terms of their illumination and at the same time to enable basic illumination of the entire spatial region.

SUMMARY

Embodiments provide an improved LED module that allows for example such illumination of a spatial region.

An LED module is provided, the LED module having a support with at least two segments, wherein each segment is embodied to emit light, and wherein each of the segments has at least two light-emitting diodes that differ in terms of their colors, wherein the LED module is embodied to set a brightness and a color of the emitted light separately for each of the segments.

A region in which adjacent light-emitting diodes are located at a small distance from one another can be referred to as a segment. For example, the distance between adjacent light-emitting diodes of one segment can be less than 200 µm. The light from the light-emitting diodes of one segment can optically superpose to form a single pixel. A defined surface area having a defined color can here be referred to as a pixel.

A segment can have, for example, two light-emitting diodes, three light-emitting diodes, four light-emitting diodes, or any other number of light-emitting diodes. If the segment has two light-emitting diodes, one of the light-emitting diodes can be embodied, for example, to emit warm white light, and the other light-emitting diode can be embodied to emit cold white light. If the segment has three light-emitting diodes, they can be embodied, for example, to emit red, green, and blue light, or red, blue, and mint-colored light, wherein the mint-colored light is generated from blue light using a phosphor-containing color conversion layer. If the segment has four light-emitting diodes, these can be embodied, for example, to emit red, green, blue, and amber-colored light.

Each segment can be assigned a solid-angle region, which is illuminated by the segment, with a secondary optical unit. In this case, the light emitted by the respective segment can be deflected into the solid-angle region by the secondary optical unit. The secondary optical unit can be arranged directly on the light-emitting diodes. The secondary optical unit can be embodied to not cause any diffusion of the light.

Owing to the fact that a brightness and color of the emitted light can be set for each segment, it is possible to realize a separate setting of the illumination for each solid-angle region. The LED module can thus make it possible to adapt the illumination separately in the solid-angle regions. In this way, some solid-angle regions can be made to stand out in terms of their illumination, for example.

The LED module can in particular be embodied to separately set the brightness of each individual light-emitting diode. Therefore, the brightness and the color of each individual pixel can be changed separately. In this way, for example, pixels that have an illumination that stands out and are embodied differently from the remaining pixels in terms of color and/or brightness can be produced. Other pixels can generate basic lighting with a lower brightness or a less noticeable color.

The light-emitting diodes of a segment can be arranged so close together that light emitted by the light-emitting diodes of one segment overlaps to form a single pixel.

A distance between adjacent light-emitting diodes of a segment can be less than 200 µm. The distance between the light-emitting diodes of a segment is preferably less than 100 µm. Such small distances are sufficient for the light from the light-emitting diodes to overlap in an imaging plane to form a single pixel. In this case, a primary optical unit effecting diffusion or mixing of the light emitted by the light-emitting diodes can be dispensed with, because the overlap of the light to form a single pixel can be made possible by the close packing of the light-emitting diodes.

The closer the light-emitting diodes of one segment can be arranged to one another, the smaller are the pixels produced, as a result of which an even better resolution can be achieved.

The light-emitting diodes of one segment should have a distance of at least 5 µm from one another. Owing to this minimum distance, it is possible to ensure that each light-emitting diode can be contacted separately with a conductor track and thus be controlled separately.

A distance between adjacent light-emitting diodes of one segment can be smaller than the shortest distance between a light-emitting diode of one segment and a light-emitting diode of another segment. Accordingly, the segments on the support can be spatially separate from one another. In this way, it can be ensured that the pixels produced by different segments do not overlap or at least do not overlap a lot.

The LED module can be embodied to emit light having a light output of more than 20 lumen per mm$^2$. Such a high illuminance can be achieved in particular by using power LEDs. The LED module is preferably embodied to emit light having an illuminance of more than 30 lumen per mm$^2$ or more than 40 lumen per mm$^2$. Such a high illuminance can be used to make solid-angle regions stand out in terms of illumination. Other solid-angle regions can be illuminated at the same time by the LED module at a lower illuminance.

The support can have a multilayer structure. The support can have a substrate including a ceramic, wherein the ceramic includes at least one of aluminum nitride, aluminum oxide or a varistor ceramic or consists of one of these materials. These ceramic materials have a high thermal conductivity. In this way, the high packing density of the light-emitting diodes can be made possible, since the materials are well suited for dissipating the heat generated by the light-emitting diodes due to power losses. In this way, overheating of the LED module can be prevented.

The varistor ceramic can be, for example, doped zinc oxide.

The LED module can have a secondary optical unit, which is configured to deflect light emitted by the segments into different solid angles.

The LED module can be free from a primary optical unit. A primary optical unit refers to optical elements that are arranged directly on the light-emitting diodes and serve for diffusion or mixing of the light emitted by the light-emitting diodes. In an alternative exemplary embodiment, a primary optical unit ensuring diffusion and/or mixing of the light emitted by the light-emitting diodes can be arranged on some segments or on all segments.

The LED module can have one or more driver chips, which can be embodied to control the light-emitting diodes. The driver chip or chips can in this case control each light-emitting diode separately. The driver chip can be connected to the light-emitting diodes via conductor tracks that are integrated in the support.

At least one segment can have light-emitting diodes that are mounted on the support in the manner of a flip-chip assembly. Alternatively, all segments can have light-emitting diodes that are mounted on the support in the manner of a flip-chip assembly.

At least one segment can have light-emitting diodes that are embodied in the form of chip scale packages (CSP). Alternatively, all segments can have light-emitting diodes that are embodied in the form of chip scale packages.

At least one segment can have multi-LED chips, on which a plurality of light-emitting diodes are arranged. Alternatively, all segments can have multi-LED chips. The multi-LED chip can have an control chip that is embodied to control the light-emitting diodes of the chip. The control chip can be a TFT chip. By using multi-LED chips, the wiring density in the support can be reduced compared to other exemplary embodiments because, rather than contacting a driver chip with each individual light-emitting diode of the segment separately, the driver chip needs to be contacted by the control chip only once. The control chip can furthermore be embodied to control the light-emitting diodes arranged thereon separately. In addition, the packing density can be increased by the use of a multi-LED chip compared to light-emitting diodes in a flip-chip assembly and compared to CSP.

A color conversion layer can be arranged over the light-emitting diodes. Alternatively, the LED module can have light-emitting diodes that have no color conversion layer.

Further embodiments relate to a method for operating the LED module for illuminating a spatial region. In this case, the brightness and the color of the segments are set such that a solid-angle region of the spatial region is made to stand out by way of a brightness and/or a color of the emitted light. The LED module can here in particular form a spotlight that makes a settable solid-angle region stand out compared to the remaining spatial region. The remaining spatial region can be illuminated with basic lighting, which has a less noticeable color or a lower brightness than the stand-out solid-angle region. The solid-angle region can be referred to as settable because the LED module can be configured to make different solid-angle regions stand out.

The stand-out solid-angle region can be changed by way of the adaptation of the brightness and/or the color setting of the segments. Accordingly, it is not necessary that always the same solid-angle region of the spatial region is made to stand out. Rather, the LED module can form a pivotable spotlight.

The LED module thus makes it possible for an individual, compact lamp without a variable optical unit to be constructed, which provides a pivotable spotlight and basic lighting. The pivoting of the spotlight can here be effected by adapting the brightness and/or the color of the segments.

Using a camera, eye movements of a human can be captured, wherein the brightness and the color setting of the segments are adapted such that the solid-angle region that has been made to stand out in terms of its illumination follows a field of view of the human calculated from the captured eye movement.

BRIEF DESCRIPTION OF THE DRAWINGS

Exemplary embodiments of the invention will be explained in more detail below with reference to the Figures.

FIG. 4 shows a further segment of an LED module;

FIG. 5 shows the use of the LED module in a light source; and

FIG. 6 shows a table listing the optical requirements that may be stipulated for a light source in various applications.

DETAILED DESCRIPTION OF ILLUSTRATIVE EMBODIMENTS

Figure 1:
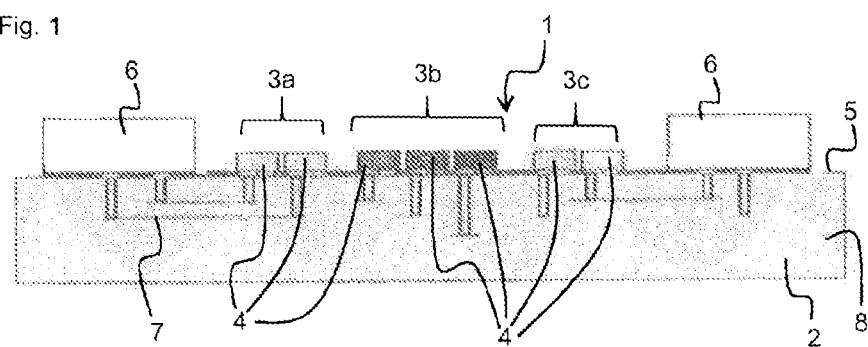
FIG. 1 shows a schematic view of a cross section of an LED module according to a first exemplary embodiment.

FIG. 1 shows a schematic view of a cross section of an LED module 1 according to a first exemplary embodiment. The LED module 1 has a support 2. Located on the support 2 are a plurality of segments 3a, 3b, 3c, wherein each of the segments 3a, 3b, 3c has at least two light-emitting diodes 4. The light-emitting diodes 4 are arranged on a surface 5 of the support 2.

FIG. 1 shows a first exemplary embodiment of the LED module 1, in which the light-emitting diodes 4 of all segments 3a-3c are embodied in the form of CSPs (chip scale packages). In an alternative configuration of the first exemplary embodiment, some or all of the light-emitting diodes 4 can be mounted on the support 2 in the manner of a flip-chip assembly.

In the cross section shown in FIG. 1, three segments 3a-3c are illustrated. In further exemplary embodiments of the LED module 1, the support 2 can have a different, in particular a significantly larger number, of segments 3a-3c. The segments 3a-3c can form an n×m matrix on the support 2. The support 2 can here have a matrix of segments 3a-3c with n rows and m columns. n and m can in this case be natural numbers of greater than or equal to 2.

Each of the segments 3a-3c has at least two light-emitting diodes 4, which differ from one another in terms of their colors. The light-emitting diodes 4 of a segment 3a-3c are arranged close to one another. For example, the distance between two adjacent light-emitting diodes 4 of a segment 3a-3c can be less than 200 μm, preferably less than 100 μm. Such a small distance between the light-emitting diodes 4 of a segment 3a-3c makes it possible that there is an optical overlap of the light emitted by the light-emitting diodes 4 to form a pixel having a defined light color in a defined surface area in the respective imaging plane.

The segments are spatially separate from one another on the support 2. Accordingly, the distance between light-emitting diodes 4 from different segments 3a-3c is always greater than the distance between two adjacent light-emitting diodes 4 of a segment.

A first segment 3a of the LED module 1 has two light-emitting diodes 4, wherein one of the light-emitting diodes 4 is embodied for emitting warm white light and the other of the light-emitting diodes is embodied to emit cold white light.

A second segment 4b of the LED module 1 has three light-emitting diodes 4. Each of the three light-emitting diodes 4 is embodied for emitting light of a respectively different color. The light emitted by the three light-emitting diodes 4 overlaps to form a white light if all the light-emitting diodes 4 are in operation. For example, the three light-emitting diodes 4 could be embodied to emit red, green, and blue light (RGB). Alternatively, the three light-emitting diodes 4 could be embodied to emit mint-colored, red, and blue light. The mint-colored light can here be produced by means of a blue light-emitting diode 4 on which a phosphor-containing color conversion layer is arranged.

A further segment (not shown in FIG. 1) can have four light-emitting diodes 4, wherein each of the light-emitting diodes 4 emits light of a different color and the light emitted by the four light-emitting diodes 4 overlaps to form a pixel. The light-emitting diodes 4 can here, for example, be embodied to emit red, green, blue, and amber-colored light (RGBA).

The light-emitting diodes 4 can be power LEDs. The LED module 1 can emit light having a light output of more than 20 lumen per mm$^2$, preferably of more than 30 lumen per mm$^2$. In the case of light-emitting diodes 4 that are embodied in the form of CSPs, the distance between two adjacent light-emitting diodes 4 can be less than 100 µm. This can result in a light output of 20 lumen per mm$^2$. In the case of light-emitting diodes 4 mounted in the manner of a flip-chip assembly, an illumination of up to 40 lumen per mm$^2$ can be attained. These details apply to light-emitting diodes 4 having a color rendering index RA90 (highest light quality) and operation at a lower limit of the level range of 2700 K correlated color temperature.

The LED module 1 furthermore has driver chips 6. The driver chips 6 are arranged on the surface 5 of the support 2. The driver chips 5 are connected to the light-emitting diodes 4 of the segments 3a-3c via conductor tracks 7, which are formed in the support 2.

The support 2 has a multilayer structure. The support 2 has layers of a ceramic material 8. The ceramic material 8 can be, for example, aluminum nitride, zinc oxide or aluminum oxide. The conductor tracks 7 integrated in the support 2 extend between the layers of the ceramic material 8.

The above-mentioned materials have a high thermal conductivity and thus allow heat generated due to the power loss of the light-emitting diodes 4 to be removed from the light-emitting diodes 4. This makes it possible to prevent the LED module 1 from overheating. The high packing density of the light-emitting diodes 4 thus becomes feasible only due to the use of a suitable ceramic material for the support 2. If the light-emitting diodes 4 are continuously operated, heat is continuously generated. The support 2 is embodied such that the heat can be dissipated away from the light-emitting diodes 4 and overheating of the LED module 1 is prevented even if the light-emitting diodes 4 are operated continuously.

The support 2 is embodied such that each of the light-emitting diodes 4 of each segment 3a-3c can be actuated separately. It is possible in this case to separately set a brightness and a color for each of the segments 3a-3c. In this way, a brightness and/or a color of the emitted light can be changed for each pixel of the LED module 1.

For example, if the green and the blue light-emitting diodes 4 in the second segment 3b are switched off and if the red light-emitting diode 4 in the second segment is operated with a high light output, a red pixel is produced by the second segment. By suitably selecting the output of each of the light-emitting diodes 4, the color and the brightness of the pixel produced by the second segment can be set as desired. This is also equally possible for each of the other segments.

The LED module 1 thus makes it possible to set the brightness and the color for each pixel by mixing the light from the light-emitting diodes 4 of the respective segment 3a-3c. Since the light-emitting diodes 4 of a segment 3a-3c are packed closely together, a primary optical unit effecting diffusion or mixing of the light emitted by the light-emitting diodes 4 is not necessary. Accordingly, such a primary optical unit can be omitted.

The LED module 1 can further have a secondary optical unit (not shown in FIG. 1). The secondary optical unit can deflect the light of each segment 3a-3c into a defined solid-angle region. In this case, each segment 3a-3c can be assigned one solid-angle region. By setting the brightness and the color of the light of the respective segment, the illumination of the solid-angle region can be set in terms of brightness and color. It can thus be made possible to make a few solid-angle regions stand out in terms of their illumination.

Figure 2:
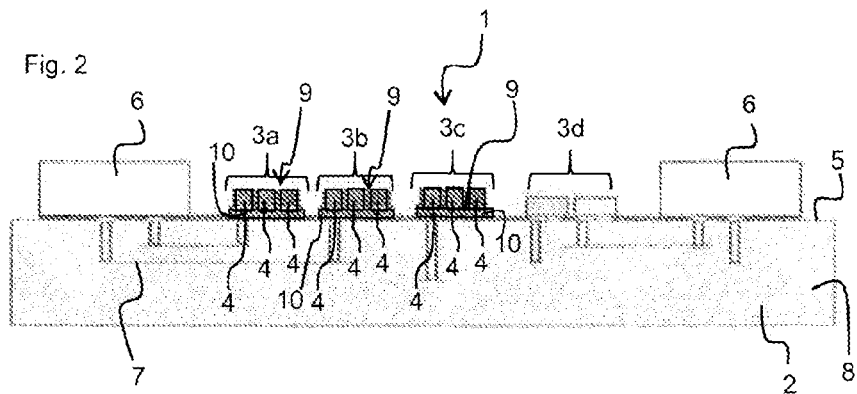
FIG. 2 shows a schematic view of a cross section of an LED module according to a second exemplary embodiment.

FIG. 2 shows a schematic view of a cross section of an LED module 1 according to a second exemplary embodiment. FIG. 2 shows by way of example four segments 3a, 3b, 3c, 3d of the LED module 1.

According to the second exemplary embodiment, some of the segments 3a-3c have multi-LED chips 9. In a multi-LED chip 9, a plurality of light-emitting diodes 4 are arranged on a single submount 10.

The light-emitting diodes 4 may be mini light-emitting diodes or micro light-emitting diodes (µLEDs). Micro LEDs are understood to mean diodes having a basic area having side lengths of less than 100 µm. µLEDs having side lengths of 3 µm to 5 µm are known. Mini LEDs have a basic area having a side length of at least 100 µm. The use of multi-LED chips 9 makes it possible to pack the light-emitting diodes 4 of a segment 3a-3d even closer together, i.e. the distances between adjacent light-emitting diodes in a segment can be reduced even more than in the first exemplary embodiment. By using the multi-LED chips, it is further possible to reduce the wiring density of the support.

FIG. 2 shows segments 3a, 3b, 3c, in which three light-emitting diodes 4 of differing colors are each arranged on the multi-LED chip 9. Any other number of light-emitting diodes 4 may also be arranged on the multi-LED chip 9. For example, n×m light-emitting diodes 4 can be arranged on the multi-LED chip 9 to form an n×m matrix, wherein n and m are greater than or equal to 2.

A segment 3d of the LED module 1 according to the second exemplary embodiment has two light-emitting diodes 4 in the form of a CSP.

The segments 3a-3d shown in the schematic view are illustrated merely by way of example. The LED module 1 can have any number of segments 3a-3c with multi-LED chips 9 and any number of segments 3d with light-emitting diodes 4 embodied in the form of a CSP.

The brightness of each individual light-emitting diode 4 can be set separately even in the second exemplary embodiment. In this way, the color and the brightness of each pixel can be changed. Each segment 3a-3d can be assigned exactly one solid-angle region. The LED module 1 makes it possible to change the illumination of each solid-angle region in terms of its color and its brightness separately from the remaining solid-angle regions. Due to the dense packing of the light-emitting diodes 4, a primary optical unit can be omitted.

Figure 3A:
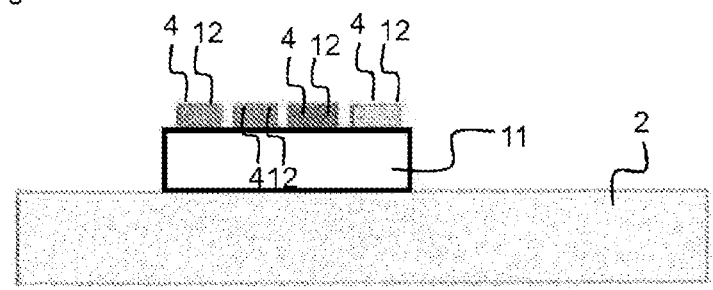
FIG. 3a shows a segment of an LED module.

FIG. 3a shows a segment of the LED module 1 according to the second exemplary embodiment. The light-emitting diodes 4 of the segment are arranged on a multi-LED chip. The multi-LED chip has an control chip 11. The control chip 11 can be a TFT (thin film transistor) chip having silicon. The control chip 11 is here embodied to control the light-emitting diodes 4 that are arranged on its top side.

FIG. 3a illustrates the control chip 11 and the light-emitting diodes 4 arranged thereon. The light-emitting diodes 4 have a color conversion layer 12. Each of the light-emitting diodes 4 can be set individually in terms of their brightness. In this way, the brightness and the color can be changed for each pixel.

Figure 3B:
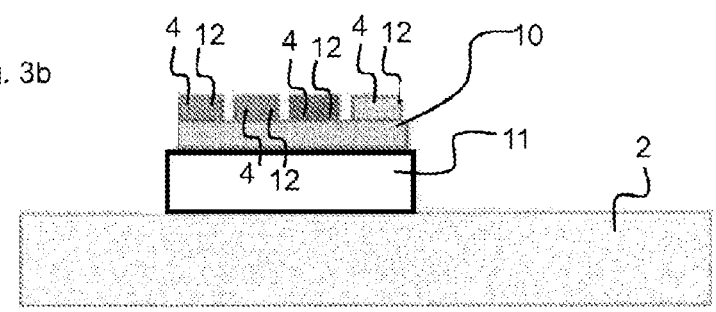
FIG. 3b shows a segment of an LED module.

FIG. 3b shows a segment of an LED module 1 according to the second exemplary embodiment, in which the light-emitting diodes 4 of a segment are arranged on a multi-LED chip 9. The multi-LED chip has the submount 10. The submount 10 is arranged between the control chip 11 and the light-emitting diodes 4. The submount 10 is arranged on a side of the control chip 11 facing away from the support 2. The light-emitting diodes 4 are arranged on a side of the submount 10 facing away from the control chip 11.

Each segment 3a-3d having a multi-LED chip 9 can have exactly one control chip 11, which actuates the light-emitting diodes 4 of the multi-LED chip 9. The control chip 11 can here be embodied for actuating each of the light-emitting diodes 4 separately.

FIG. 4 shows a further segment of the LED module 1. The segment shown in FIG. 4 has a multi-LED chip 9, on which five light-emitting diodes 4 are arranged. The light-emitting diodes 4 have no color conversion layer. Each of the light-emitting diodes 4 is embodied to emit light of a different color.

FIG. 5 shows the use of the LED module 1 in a light source 13. FIG. 5 here schematically shows the lighting that is affected by an individual segment 3a of the LED module 1. The light source 13 illuminates an imaging plane, which is arranged at a distance d from the light source, wherein an opening angle of the light emitted by a segment is denoted with α. FIG. 5 further illustrates the pixel size of the pixel produced by the one segment.

FIG. 6 lists the optical requirements that may be stipulated for such a light source 13 in various applications in a table. Applications that are considered in this case are an office, in particular a desk, a restaurant, a museum, a reading light and a store.

The LED module 1 makes it possible to illuminate a spatial region and in the process to make a specific solid-angle region of the spatial region stand out by using a greater brightness and/or a different color in the solid-angle region than for the illumination of the remaining spatial region. Since color and brightness are settable for each pixel of the LED module 1, the solid-angle region that is intended to stand out can be changed and adapted. In this way, an LED module that has a pivotable spotlight is created. Spotlight can here refer to the solid-angle region that has been made to stand out in terms of its illumination.

The LED module 1 is configured to generate illumination during which basic lighting is provided in the entire emission region of the light source and furthermore individual solid-angle regions are made to stand out in a targeted manner with a greater light intensity and/or different correlated color temperatures. For this purpose, the LED module 1 can be combined with a secondary optical unit, which directs the light emitted by the light-emitting diodes 4 into different solid-angle regions.

The possibility of making individual solid angles stand out by way of the illumination can be used in illumination that is used for example in a store. In this case, the eye movements of a viewer can be ascertained by means of a camera. A field of view of the viewer can be calculated from the ascertained eye movements. The LED module 1 can now be actuated such that the brightness and/or the color of the light-emitting diodes 4 of the individual segments 3a-3d are set such that a spotlight with standout illumination is created and always follows the field of view of the viewer. In this way, specific regions can be accentuated in terms of their illumination in a targeted manner. Adaptive control in the lighting of a shelf or of a sales region is provided.

Although the invention has been illustrated and described in detail by means of the preferred embodiment examples, the present invention is not restricted by the disclosed examples and other variations may be derived by the skilled person without exceeding the scope of protection of the invention.

The invention claimed is:
1. An LED module comprising:
a support having at least two segments,
wherein each segment is configured to emit light,
wherein each segment has at least two light-emitting diodes that differ in terms of their colors,
wherein the support has a multilayer structure and/or wherein the support has a substrate having a ceramic material and the ceramic material comprises aluminum nitride, aluminum oxide or a varistor ceramic,
wherein the LED module is configured to set a brightness and a color of the emitted light separately for each segment, and
wherein at least one segment has a multi-LED chip comprising a control chip on which a plurality of light-emitting diodes are arranged and which is configured to actuate the light-emitting diodes of the multi-LED chip.

2. The LED module according to claim 1, wherein the LED module is configured to set the brightness for each light-emitting diode separately.

3. The LED module according to claim 1, wherein the light-emitting diodes of a segment are arranged so close to one another that light emitted by the light-emitting diodes of one segment overlaps to form a single pixel.

4. The LED module according to claim 1, wherein a distance between adjacent light-emitting diodes of a segment is less than 200μm.

5. The LED module according to claim 1, wherein a distance between adjacent light-emitting diodes of a segment is smaller than a shortest distance between a light-emitting diode of one segment and a light-emitting diode of another segment.

6. The LED module according to claim 1, wherein the support has the multilayer structure with layers of the ceramic material, and wherein conductor tracks integrated in the support extend between the layers of the ceramic material.

7. The LED module according to claim 1, wherein the LED module has a secondary optical unit configured to deflect light emitted by the segments into different solid angles.

8. The LED module according to claim 1, wherein the LED module is free from a primary optical unit.

9. The LED module according to claim 1,
wherein at least one segment has light-emitting diodes mounted on the support in a manner of a flip-chip assembly, and
wherein at least one segment has light-emitting diodes embodied in form of a chip scale package.

10. A method for operating the LED module according to claim 1, the method comprising:
illuminating a spatial region,
wherein a brightness and a color of the segments are set such that a solid-angle region of the spatial region stands out by way of the brightness and/or the color of the emitted light.

11. The method according to claim 10, wherein the solid-angle region is changed by setting the brightness and/or the color of the segments.

12. The method according to claim 10, further comprising:
capturing an eye movement of a human by a camera,
wherein the brightness and the color of the segments are set such that the solid-angle region that stands out in terms of its illumination follows a field of view of the human calculated from the captured eye movement.

13. The LED module according to claim 1, wherein at least one segment has light-emitting diodes mounted on the support in a manner of a flip-chip assembly.

14. The LED module according to claim 1, wherein at least one segment has light-emitting diodes embodied in form of a chip scale package.

\* \* \* \* \*